United States Patent
Koike et al.

(10) Patent No.: US 8,058,736 B2
(45) Date of Patent: Nov. 15, 2011

(54) SEMICONDUCTOR DEVICE HAVING HEAT SPREADER WITH CENTER OPENING

(75) Inventors: Masahiro Koike, Kanagawa (JP); Kenichi Kurihara, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 952 days.

(21) Appl. No.: 11/808,309

(22) Filed: Jun. 8, 2007

(65) Prior Publication Data

US 2007/0296076 A1    Dec. 27, 2007

(30) Foreign Application Priority Data

Jun. 9, 2006   (JP) ................................ 2006-160595

(51) Int. Cl.
    *H01L 23/28* (2006.01)
(52) U.S. Cl. ........ 257/796; 257/276; 257/625; 257/675; 257/706; 257/717; 257/E23.092
(58) Field of Classification Search ................. 257/276, 257/625, 675, 706, 717, 796, E23.092
    See application file for complete search history.

(56) References Cited

U.S. PATENT DOCUMENTS

| | | | | |
|---|---|---|---|---|
| 5,940,271 A | * | 8/1999 | Mertol | 361/704 |
| 6,445,062 B1 | * | 9/2002 | Honda | 257/678 |
| 6,469,380 B2 | | 10/2002 | Sorimachi et al. | |
| 6,969,640 B1 | | 11/2005 | Dimaano, Jr. | |
| 7,482,686 B2 | * | 1/2009 | Zhao et al. | 257/710 |
| 2004/0262766 A1 | * | 12/2004 | Houle | 257/758 |
| 2005/0117296 A1 | * | 6/2005 | Wu et al. | 361/697 |
| 2005/0139997 A1 | * | 6/2005 | Chou | 257/712 |

FOREIGN PATENT DOCUMENTS

| | | |
|---|---|---|
| JP | 5-24075 | 2/1993 |
| JP | 8-139223 | 5/1996 |
| JP | 2000-77575 | 3/2000 |
| JP | 2001-102495 | 4/2001 |
| JP | 2002-151633 | 5/2002 |
| JP | 2002-158316 | 5/2002 |
| JP | 2002-252313 | 9/2002 |
| JP | 2002-270638 | 9/2002 |
| JP | 2004-140275 | 5/2004 |
| JP | 2004-327556 | 11/2004 |
| KR | 10-2004-0061845 | 7/2004 |
| KR | 10-0456816 | 11/2004 |

OTHER PUBLICATIONS

Japanese Office Action dated Jul. 12, 2011 in corresponding Japanese Application No. 2007-145852 with English translation of enclosed lined portions of the Japanese Office Action.

* cited by examiner

*Primary Examiner* — Thanh V Pham (74) *Attorney, Agent, or Firm* — Young & Thompson (57) ABSTRACT

The present invention provides a semiconductor device including: a semiconductor chip mounted on a substrate; a heat spreader provided above the semiconductor chip; and a sealing resin interposed between the semiconductor chip and the heat spreader and covering the semiconductor chip. The heat spreader is not in contact with any of the substrate and the semiconductor chip, and has an opening.

19 Claims, 13 Drawing Sheets

SEMICONDUCTOR DEVICE HAVING HEAT SPREADER WITH CENTER OPENING

This application is based on Japanese Patent application No. 2006-160595, the content of which is incorporated hereinto by reference.

BACKGROUND

1. Technical Field

The present invention relates to a semiconductor device and an apparatus and method for manufacturing the same.

2. Related Art

Figure 16:
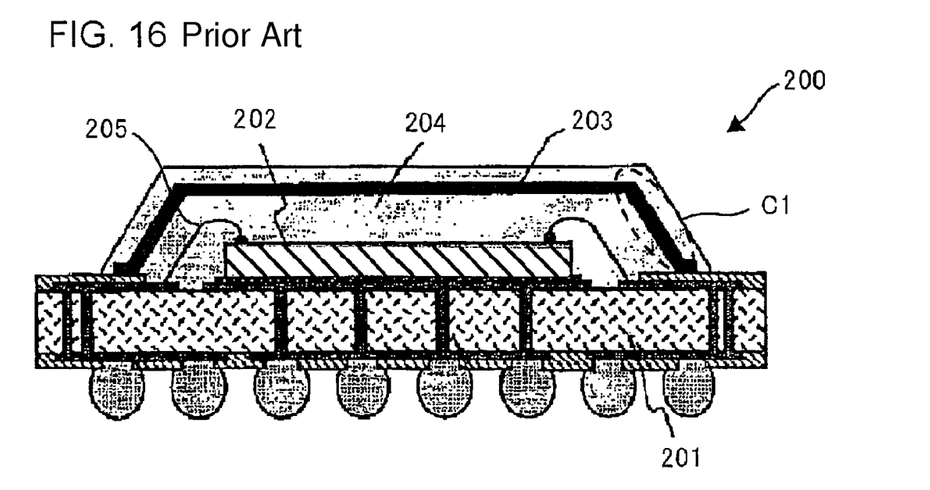
FIG. 16 is a cross sectional view showing a conventional semiconductor device.

FIG. 16 is a cross sectional view showing a semiconductor device described in Japanese Unexamined Patent Publication No. 8-139223. In a semiconductor device 200, a semiconductor chip 202 is mounted over a substrate 201 by wire bonding. That is, the substrate 201 and the semiconductor chip 202 are electrically connected to each other via a wire 205. Above the semiconductor chip 202, a heat spreader 203 is provided via a sealing resin 204. The periphery of the heat spreader 203 is bent, and the tip of the bent portion (the portion surrounded by a broken line C1) is attached to the substrate 201.

As documents of the conventional arts related to the present invention, there are Japanese Unexamined Patent Publication Nos. 2004-140275, 2001-102495, 2000-77575, 2002-270638, and 2002-252313 in addition to Japanese Unexamined Patent Publication No. 8-139223.

In the semiconductor device 200 of FIG. 16, from the viewpoint of heat dissipation performance, it is preferable to dispose the heat spreader 203 close to the semiconductor chip 202 as much as possible. On the other hand, when the heat spreader 203 is disposed too close to the semiconductor chip 202, there is the possibility that the heat spreader 203 comes into contact with the wire 205 and the wire 205 is damaged. Therefore, it is important to control the height of the heat spreader 203, that is, the interval between the heat spreader 203 and the semiconductor chip 202.

In the semiconductor device 200, however, the tip of the bent portion of the heat spreader 203 is attached to the substrate 201 as described above. Consequently, the height of the heat spreader 203 is determined by the height of the bent portion. In other words, the height of the heat spreader 203 is determined by the shape of the heat spreader 203 itself. Therefore, the heat spreader 203 has to be formed in accordance with a desired height of the heat spreader 203. For example, in the case where the desired height of the heat spreader varies among a plurality of semiconductor devices, the heat spreader has to be formed for each of the semiconductor devices. It increases the manufacturing cost of the semiconductor devices.

SUMMARY

According to the present invention, there is provided a semiconductor device including: a semiconductor chip mounted on a substrate; a heat spreader provided above the semiconductor chip; and a sealing resin interposed between the semiconductor chip and the heat spreader and covering the semiconductor chip, wherein the heat spreader is not in contact with any of the substrate and the semiconductor chip, and has an opening.

In the semiconductor device, the heat spreader is not in contact with any of the substrate and the semiconductor chip. Therefore, the semiconductor device is different from the conventional semiconductor device described with reference to FIG. 16, and the height of the heat spreader is not determined by the shape of the heat spreader itself. Consequently, it is unnecessary to form the heat spreader in accordance with a desired height of the heat spreader. For example, even in the case where the desired height of the heat spreader varies among a plurality of semiconductor devices, the heat spreader having the same shape can be commonly used for the semiconductor devices.

According to the present invention, there is also provided an apparatus for manufacturing the semiconductor device, including a mold that holds the substrate on which the semiconductor chip is mounted and the heat spreader so that the semiconductor chip and the heat spreader face each other with a predetermined space therebetween, wherein the mold has a supply part that supplies the sealing resin to the space between the semiconductor chip and the heat spreader via the opening in the heat spreader.

In the manufacturing apparatus, the substrate on which the semiconductor chip is mounted and the heat spreader are held by the mold so that the semiconductor chip and the heat spreader face each other with a predetermined space therebetween. Consequently, the height of the heat spreader can be controlled with high precision.

According to the present invention, there is also provided a method for manufacturing the semiconductor device, including: holding the substrate on which the semiconductor chip is mounted and the heat spreader so that the semiconductor chip and the heat spreader face each other with a predetermined space therebetween; and supplying the sealing resin to the space between the semiconductor chip and the heat spreader via the opening in the heat spreader held in said holding.

In the manufacturing method, the substrate on which the semiconductor chip is mounted and the heat spreader are held so that the semiconductor chip and the heat spreader face each other with a predetermined space therebetween. Consequently, the height of the heat spreader can be controlled with high precision.

According to the present invention, the semiconductor device having a structure suitable for manufacture at low cost and the apparatus and method for manufacturing the same are realized.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

A semiconductor device and an apparatus and method for manufacturing the same according to the present invention will be described in detail hereinbelow with reference to the drawings. In the description of the drawings, the same reference numerals are designated to the same components and descriptions will not be repeated.

First Embodiment

Figure 1:
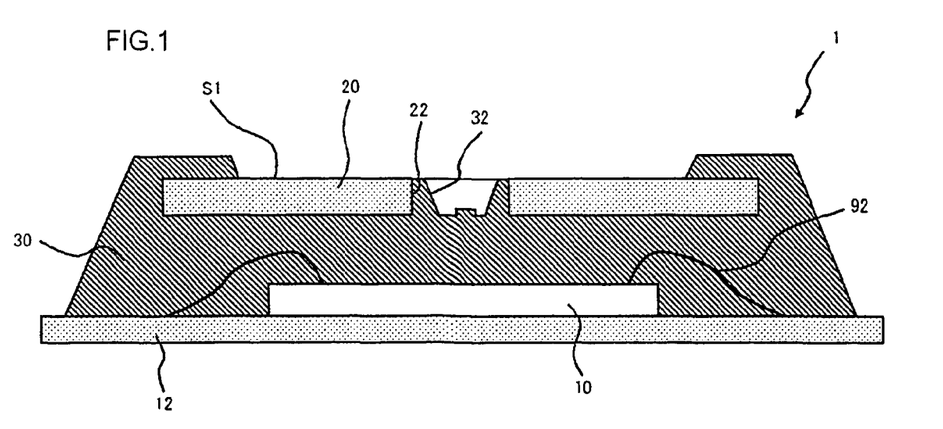
FIG. 1 is a cross sectional view showing an embodiment of a semiconductor device according to the present invention.
Figure 2:
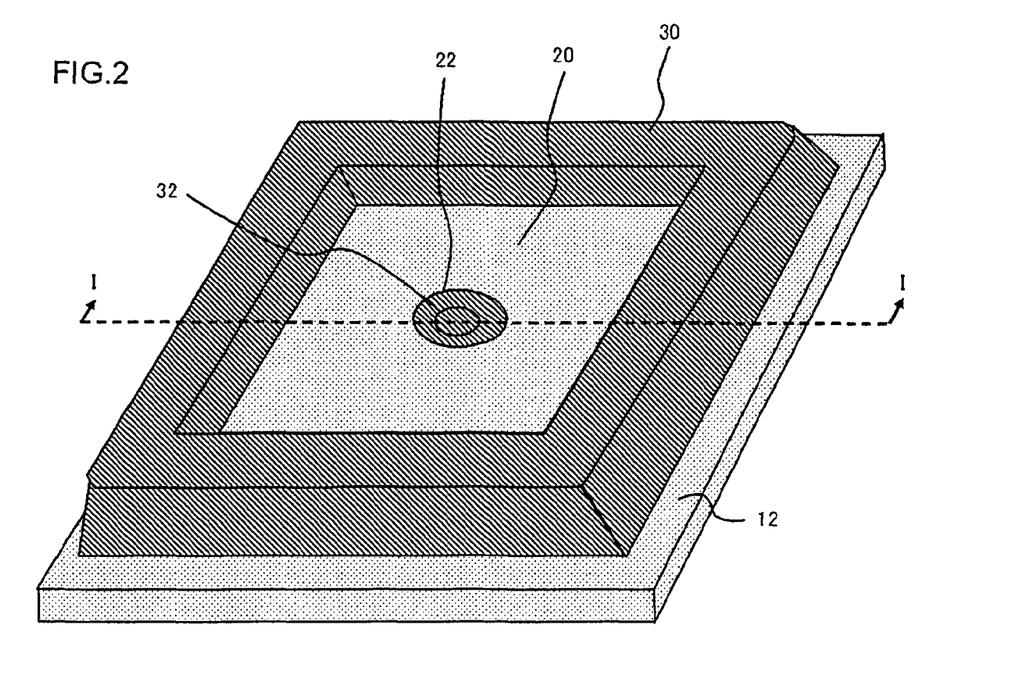
FIG. 2 is a perspective view showing the semiconductor device of FIG. 1.

FIG. 1 is a cross sectional view showing an embodiment of a semiconductor device according to the invention. FIG. 2 is a perspective view showing the semiconductor device. The cross section taken along line I-I of FIG. 2 corresponds to FIG. 1. A semiconductor device 1 has a semiconductor chip 10 mounted on a substrate 12, a heat spreader 20 provided over the semiconductor chip 10, and a sealing resin 30 interposed between the semiconductor chip 10 and the heat spreader 20 and covering the semiconductor chip 10. The heat spreader 20 is not in contact with any of the substrate 12 and the semiconductor chip 10 and has an opening 22.

The semiconductor chip 10 is mounted on the substrate 12 by wire bonding. That is, the semiconductor chip 10 and the substrate 12 are electrically connected to each other via a wire 92. As the substrate 12, for example, a glass epoxy substrate can be used.

Figure 3:
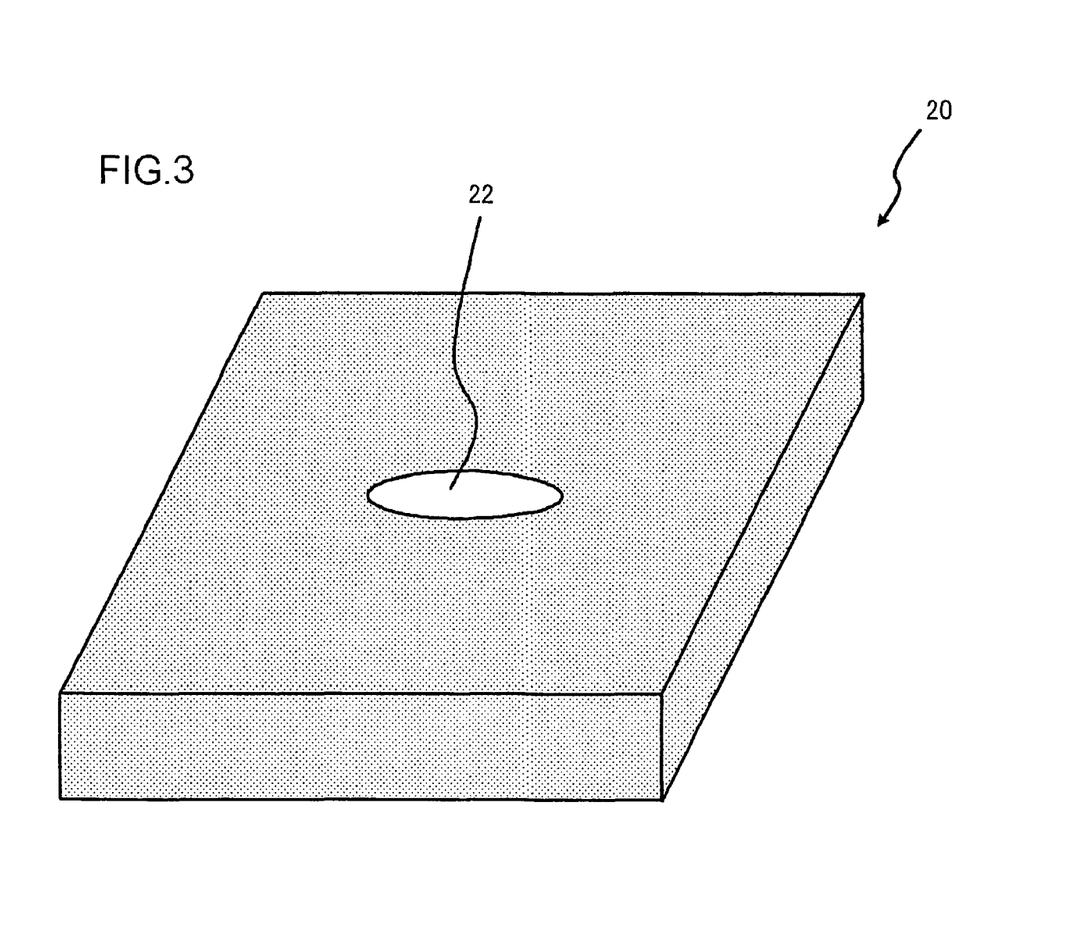
FIG. 3 is a perspective view showing a heat spreader in the semiconductor device of FIG. 1.

FIG. 3 is a perspective view showing the heat spreader 20. As seen from the diagram, the heat spreader 20 has a flat plate shape. The opening 22 is provided in approximately the center of the heat spreader 20.

Referring again to FIGS. 1 and 2, only a partial region including the periphery in the top surface S1 (the surface on the side opposite to the semiconductor chip 10) of the heat spreader 20 is covered with the sealing resin 30. The other region in the top surface S1 of the heat spreader 20 is exposed to the outside of the semiconductor device 1. The opening 22 is not also covered with the sealing resin 30 but is exposed to the outside. The sealing resin 30 is applied also to the inside of the opening 22. The sealing resin 30 provided on the inside of the opening 22 has a recess 32. The recess 32 is derived from the structural features of a manufacturing apparatus to be described later.

Figure 4:
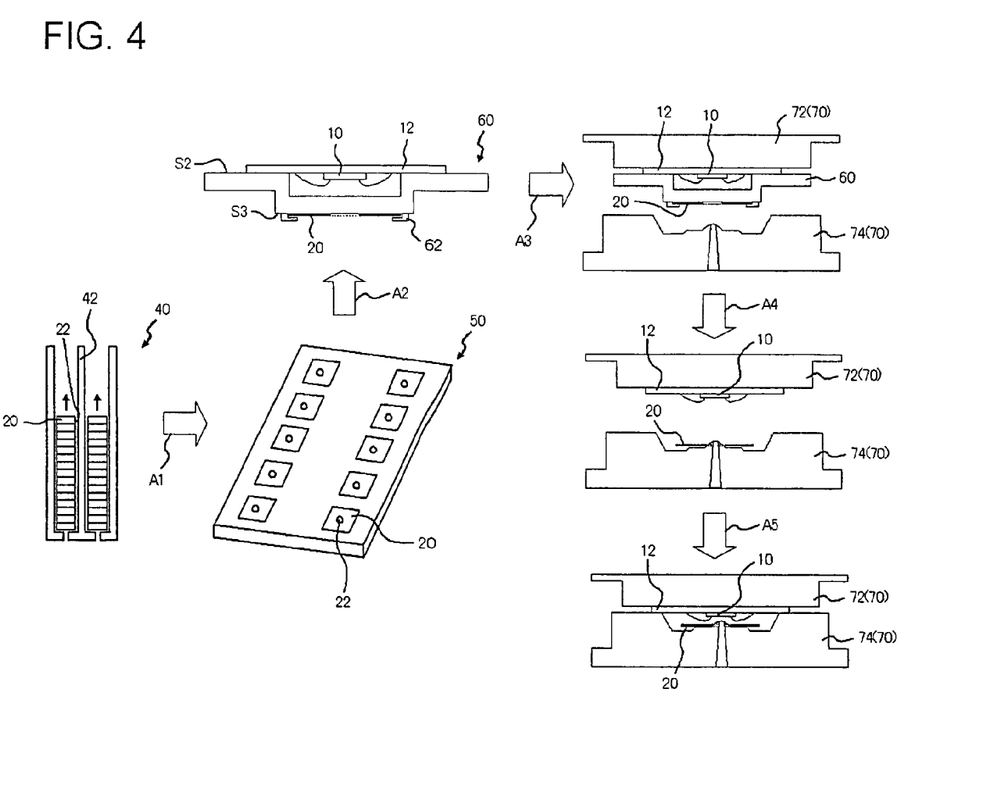
FIG. 4 is a diagram illustrating an example of manufacturing processes of the semiconductor device of FIG. 1.

With reference to FIG. 4 and FIGS. 5A to 5C, as an embodiment of an apparatus and method of manufacturing a semiconductor device according to the invention, an example of process of manufacturing the semiconductor device 1 will be described. The manufacturing apparatus has, as shown in FIG. 4, a heat spreader stocker 40, a stage 50, a supply hand 60, and a mold 70. In the embodiment, the mold 70 includes an upper mold 72 (first mold) and a lower mold 74 (second mold). The upper mold 72 is a mold for holding the substrate 12 on which the semiconductor chip 10 is mounted, and the lower mold 74 is a mold for holding the heat spreader 20.

In the heat spreader stocker 40, a plurality of heat spreaders 20 to be passed to the stage 50 are housed in a stacked state. The heat spreader stocker 40 has a rod member 42 penetrating the opening 22 in the heat spreader 20. On the stage 50, a plurality of heat spreaders 20 to be passed to the supply hand 60 are arranged.

The supply hand 60 supplies the substrate 12 on which the semiconductor chip 10 is mounted and the heat spreaders 20 to the upper and lower molds 72 and 74, respectively. The supply hand 60 has a surface S2 (first surface) on which the substrate 12 is mounted and a surface S3 (second surface) which is a surface on the side opposite to the surface S2 and on which the heat spreader 20 is mounted. On the surface S3 of the supply hand 60, nails 62 for retaining the heat spreader 20 are provided. However, it is not always necessary to provide the nails 62. In the case where the nails 62 are not provided, the supply hand 60 holds the heat spreader 20 by, for example, attraction.

The passing of the heat spreader 20 and the like among the heat spreader stocker 40, the stage 50, the supply hand 60, and the mold 70 will be described. First, the heat spreaders 20 housed in the heat spreader stocker 40 are sequentially arranged onto the stage 50 (arrow A1). Next, the heat spreader 20 on the stage 50 is picked up by the supply hand 60 (arrow A2). On the surface S2 of the supply hand 60, the substrate 12 on which the semiconductor chip 10 is mounted is placed. Subsequently, the supply hand 60 supplies the substrate 12 on the surface S2 to the upper mold 72 (arrow A3). The supply hand 60 also supplies the heat spreader 20 on the surface S3 to the lower mold 74 (arrow A4). After that, the upper and lower molds 72 and 74 are brought close to each other (arrow A5). By the operations, in a state where the semiconductor chip 10 and the heat spreader 20 face each other with a predetermined gap therebetween, the substrate 12 and the heat spreader 20 are held by the upper mold 72 and the lower mold 74, respectively.

Figure 5A:
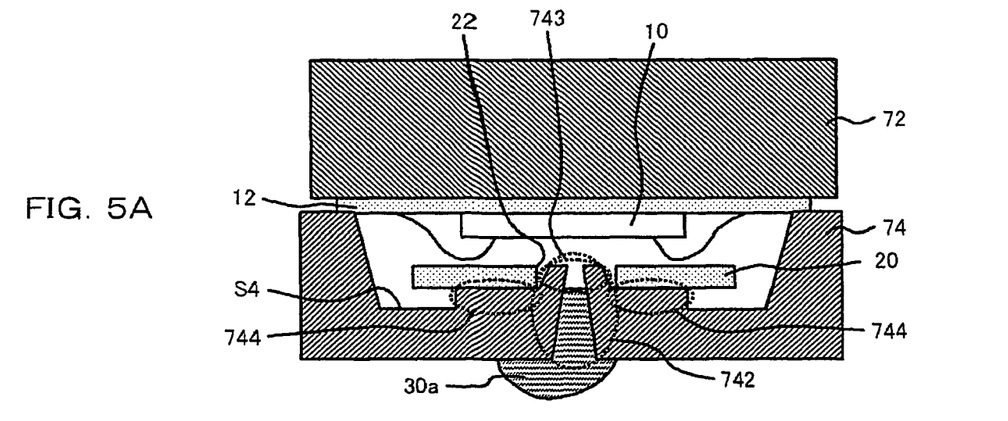
FIGS. 5A to 5C are cross sectional views showing an example of the manufacturing process of the semiconductor device of FIG. 1.

Referring to FIG. 5A, the configuration of the lower mold 74 will be described more specifically. FIG. 5A is a cross sectional view showing a state where the substrate 12 and the heat spreader 20 are held by the upper mold 72 and the lower mold 74, respectively, and corresponds to the diagram after the arrow A5 in FIG. 4.

The lower mold 74 has a supply part 742 and a mounting part 744. The supply part 742 is a part for supplying a sealing resin 30a which will become the sealing resin 30, to the space between the semiconductor chip 10 and the heat spreader 20 via the opening 22 in the heat spreader 20. The mounting part 744 is a part on which the heat spreader 20 is mounted. The supply part 742 and the mounting part 744 are linked.

The supply part 742 includes a hollow projection 743 projected from the mounting part 744. The projection 743 is constructed so as to enter the opening 22 in the heat spreader 20 mounted on the mounting part 744. The projection 743 has a tapered shape which is tapered from the mounting part 744.

The mounting part 744 is provided at a position higher than a bottom surface S4 of the lower mold 74. The lower mold 74 is formed so that a partial region including the periphery of the surface on the mounting part 744 side of the heat spreader 20 mounted on the mounting part 744 sticks out the mounting part 744.

Figure 5B:
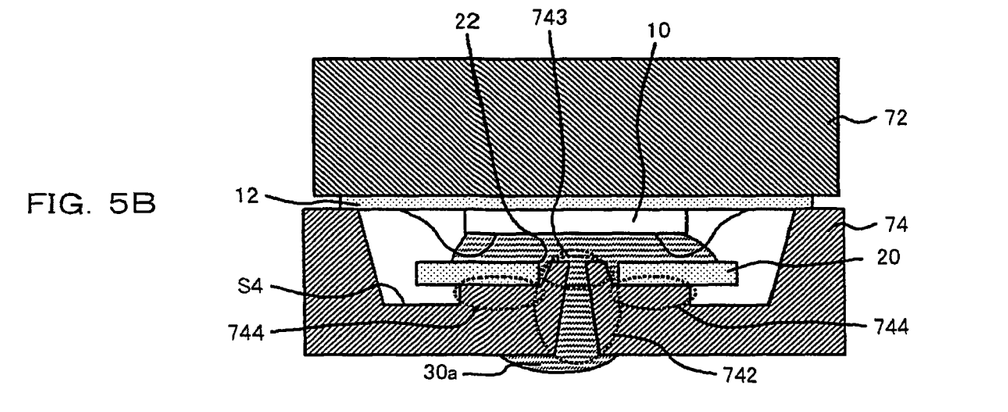
Figure 5C:
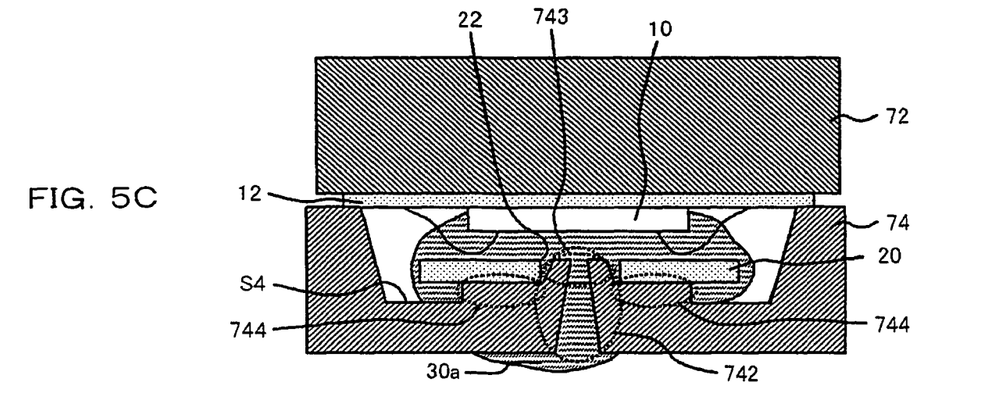

In the lower mold 74 having such a configuration, as shown in FIG. 5A, the sealing resin 30a is supplied to the space between the semiconductor chip 10 and the heat spreader 20 via the supply part 742. As shown in FIG. 5B, when the supply of the sealing resin 30a is continued, the heat spreader 20 is pressed against the mounting part 744 by the pressure of the sealing resin 30a. Consequently, the heat spreader 20 is firmly held by the lower mold 74. When the supply is continued further, as shown in FIG. 5C, the sealing resin 30a covers the side faces of the heat spreader 20, and the heat spreader 20 is held more firmly by the lower mold 74.

The supply of the sealing resin 30 is continued until the space between the upper mold 72 and the lower mold 74 is filled with. After that, by detaching the upper and lower molds 72 and 74, the semiconductor device 1 shown in FIGS. 1 and 2 is obtained. Now, it is understood that the recess 32 in the sealing resin 30 in the semiconductor device 1 is derived from the projection 743 of the lower mold 74. That is, the recess 32 is the mark of the projection 743 made when the lower mold 74 is detached.

The effects of the embodiment will be described. In the semiconductor device 1, the heat spreader 20 is not in contact with any of the substrate 12 and the semiconductor chip 10. Therefore, the semiconductor device 1 is different from the conventional semiconductor device described with reference to FIG. 16, and the height of the heat spreader 20 is not determined by the shape of the spreader 20 itself. Consequently, it is unnecessary to form the heat spreader 20 in accordance with a desired height of the heat spreader 20. For example, even in the case where the desired height of the heat spreader 20 varies among a plurality of semiconductor devices, the heat spreader 20 having the same shape can be commonly used for the semiconductor devices. Therefore, the semiconductor device 1 having the structure suitable for low-cost manufacture is realized.

In the manufacturing apparatus and method as described above, the substrate 12 on which the semiconductor chip 10 is mounted and the heat spreader 20 are held by the mold 70 so that the semiconductor chip 10 and the heat spreader 20 face each other with a predetermined space therebetween. Consequently, the height of the heat spreader 20 can be controlled with high precision.

The opening 22 is provided in the heat spreader 20. Via the opening 22, the sealing resin 30a can be easily supplied to the space between the semiconductor chip 10 and the heat spreader 20. Particularly, the opening 22 is formed in generally the center of the heat spreader 20. Thus, at the time of supplying the sealing resin 30a via the opening 22, the heat spreader 20 can be pressed against the mounting part 744 with excellent balance. This point will be described with reference to FIG. 5B. Since the opening 22 is positioned in approximately the center of the heat spreader 20, the pressure received from the sealing resin 30a on the right and left sides from the opening 22 of the heat spreader 20 are almost equal to each other. Therefore, the forces in the horizontal directions in the diagram applied on the heat spreader 20 can be suppressed and a positional deviation of the heat spreader 20 can be effectively prevented.

The heat spreader 20 has a flat plate shape. Thus, it is easy to form the heat spreader 20, and is easy to handle the heat spreader 20 in the manufacturing processes.

A partial region including the peripheral region of the top surface S1 of the heat spreader 20 is covered with the sealing resin 30. With the configuration, the heat spreader 20 can be firmly fixed by the sealing resin 30. Simultaneously, the other region in the top surface S1 is exposed, so that the semiconductor device 1 having excellent heat dissipation performance is realized.

The configuration is derived from the structure of the lower mold 74. That is, as described with reference to FIG. 5A, the mounting part 744 is provided in a position higher than the bottom surface S4 in the lower mold 74, and the heat spreader 20 lies off the mounting part 744. Naturally, only the part sticking out the mounting part 744 in the top surface S1 of the heat spreader 20 is covered with the sealing resin 30. Therefore, according to the embodiment, without adding a step for exposing the heat spreader 20 (for example, a step of grinding the sealing resin on the heat spreader 20), the semiconductor device 1 in which a part of the heat spreader 20 is exposed can be obtained.

The supply part 742 of the lower mold 74 has the projection 743 constructed so as to enter the opening 22 in the heat spreader 20. Therefore, by using the projection 743 as a guide, positioning at the time of supplying the heat spreader 20 to the lower mold 74 can be performed easily. The projection 743 also has the function of preventing the positional deviation of the heat spreader 20.

The projection 743 has the tapered shape in which the diameter of the projection 743 becomes smaller as the projection is away from the mounting part 744. With the shape, the projection 743 can be easily taken out from the sealing resin 30a at the time of detaching the lower mold 74.

The supply hand 60 has the surface S2 on which the substrate 12 is mounted and the surface S3 on which the heat spreader 20 is mounted. With the structure, one supply hand 60 can carry the substrate 12 and the heat spreader 20 at the same time. Consequently, the number of processes can be reduced as compared with the case of carrying the substrate 12 and the heat spreader 20 by different supply hands.

The heat spreader stocker 40 has the rod member 40 penetrating the openings 22 of the heat spreaders 20. Thus, the positional deviation of the heat spreaders 20 in the heat spreader stocker 40 can be prevented.

In the semiconductor device 200 of FIG. 16, as described above, a part of the heat spreader 203 is connected to the substrate 201. The position of the connection part between the heat spreader 203 and the substrate 201 is regulated to the configuration of the substrate 201. Therefore, in the case where the position of the connection part varies among a plurality of substrates, it is necessary to form the heat spreader 203 for each of the substrates. That is, the heat spreader 203 has to be formed in accordance with not only the desired height but also the position of the connection part between the heat spreader 203 and the substrate 201. With respect to this point, in the semiconductor device 1, the heat spreader 20 is not in contact with any of the substrate 12 and the semiconductor chip 10. Therefore, irrespective of configurations of substrates, the heat spreader of the same shape can be used.

Further, in the case of injecting the sealing resin without connecting the heat spreader 203 and the substrate 201 in the semiconductor device 200 of FIG. 16, there is the possibility that the position of the heat spreader 203 is deviated. Also, due to the positional deviation, the wire 205 can be damaged. On the other hand, in the case of attaching the heat spreader 203 to the substrate 201 in order to prevent the positional deviation of the heat spreader 203, the number of manufacturing steps increases, and it increases the manufacturing cost. In contrast, in the semiconductor device 1, the heat spreader 20 is pressed against the lower mold 74 by the pressure applied at the time of injecting the sealing resin 30a. Therefore, the positional deviation of the heat spreader 20 can be prevented without increasing the number of manufacturing steps.

The semiconductor device and the apparatus and method of manufacturing the same according to the invention are not limited to the foregoing embodiment but can be variously modified. In the embodiment, the case of holding the substrate 12 and the heat spreader 20 by the upper and lower molds 72 and 74 has been described as an example. However, both of the substrate 12 and the heat spreader 20 may be held by an intermediate mold.

Figure 6A:
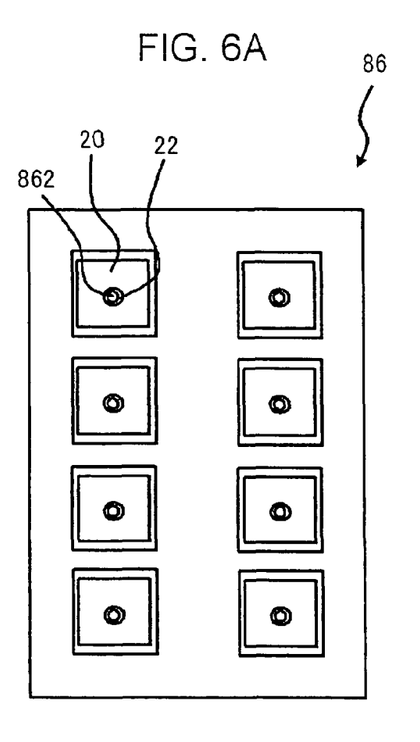
FIGS. 6A and 6B are plan views showing an example of an intermediate mold.
Figure 6B:
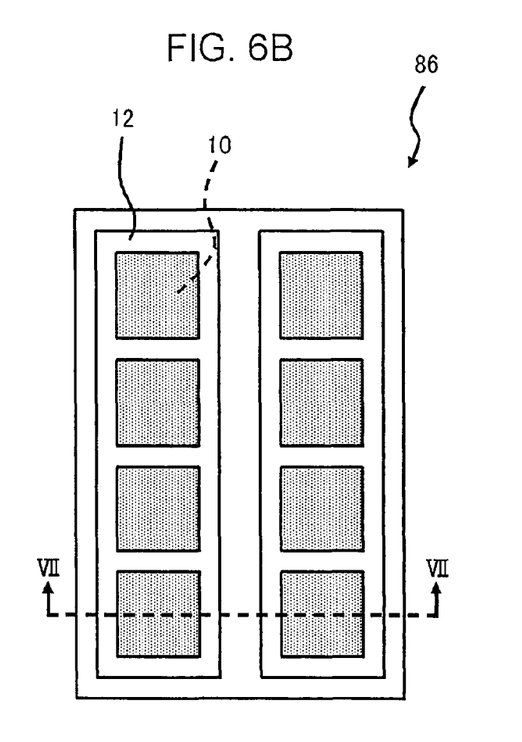
Figure 7:
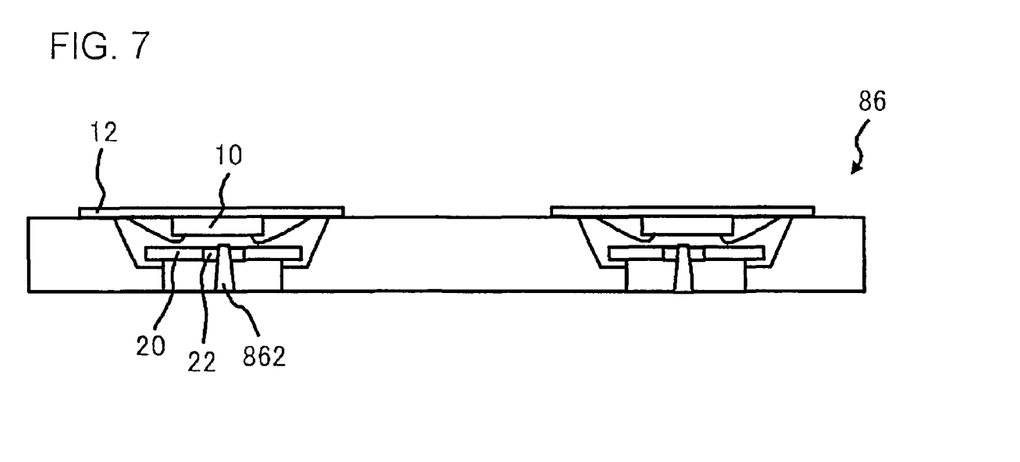
FIG. 7 is a cross sectional view of the intermediate mold of FIGS. 6A and 6B.

FIGS. 6A and 6B are plan views showing an example of an intermediate mold. FIG. 6A shows an intermediate mold 86 in a state where the heat spreader 20 is mounted. FIG. 6B shows the intermediate mold 86 in a state where the substrate 12 is mounted in addition to the heat spreader 20. FIG. 7 shows a cross section taken along line VII-VII of FIG. 6B. As seen from the diagram, a supply part 862 is formed in the intermediate mold 86. The supply part 862 is a part for supplying the sealing resin 30a to the space between the semiconductor chip 10 and the heat spreader 20 via the opening 22 in the heat spreader 20 in a manner similar to the supply part 742 (see FIG. 5A).

Figure 8:
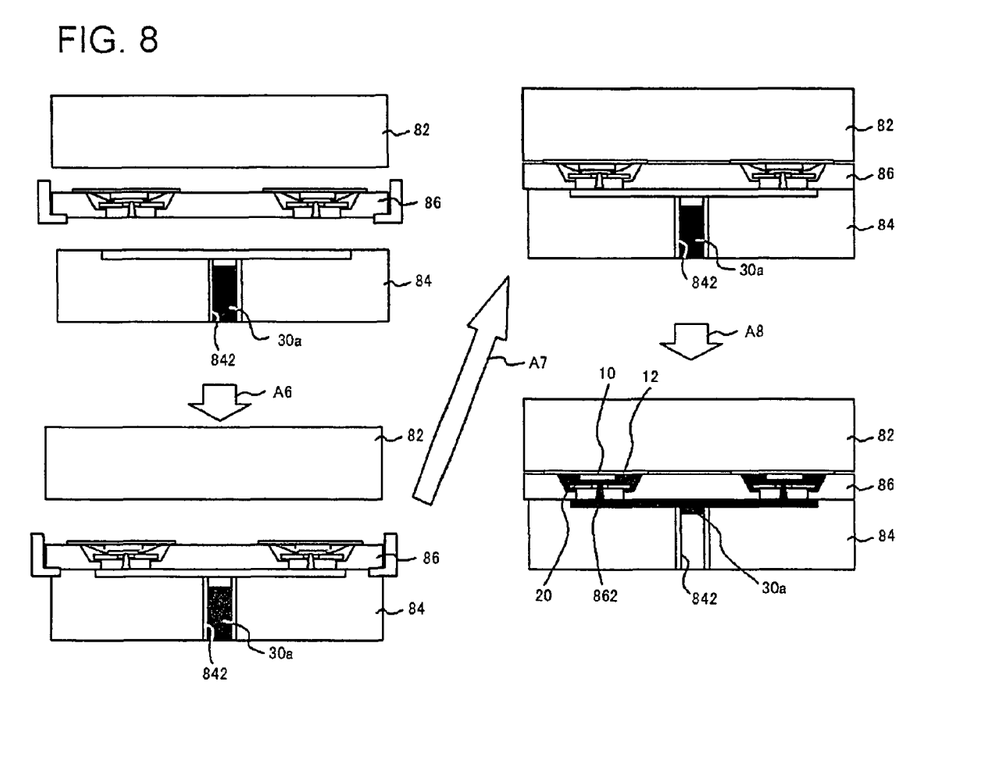
FIG. 8 is a diagram showing an example of manufacturing processes of the semiconductor device using the intermediate mold of FIGS. 6A and 6B.

As shown in FIG. 8, the intermediate mold 86 is carried between the upper and lower molds 82 and 84 while holding the substrate 12 and the heat spreader 20. In the lower mold 84, a hole 842 for supplying resin is formed. After that, the intermediate mold 86 is mounted on the lower mold 84 (arrow A6). Subsequently, the intermediate mold 86 is fixed by being sandwiched by the upper and lower molds 82 and 84 (arrow A7). After that, the sealing resin 30a is supplied to the space between the semiconductor chip 10 and the heat spreader 20 via the hole 842 and the supply part 862 (arrow A8).

Figure 9:
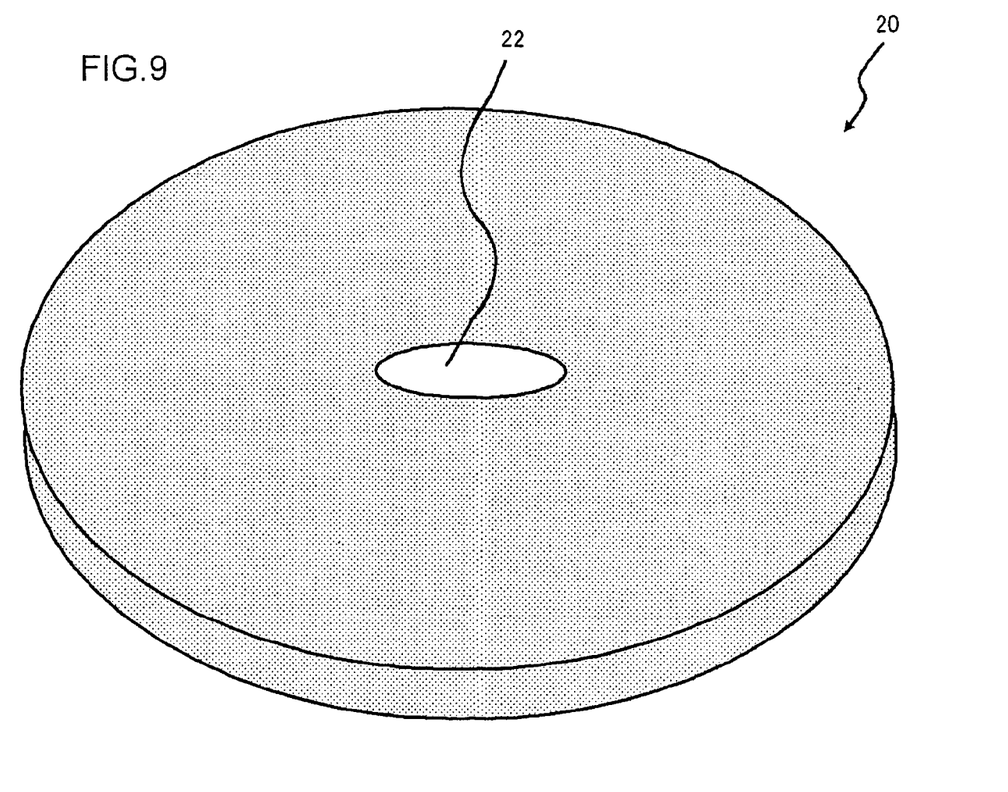
FIG. 9 is a perspective view showing a heat spreader as a modification of the embodiment.

In the embodiment, the heat spreader 20 having a rectangular shape in plan view is shown. However, the shape in plan view of the heat spreader 20 is not limited to the rectangular shape. For example, as shown in FIG. 9, the heat spreader 20 may have a circular shape in plan view. Further, the heat spreader 20 is not limited to a flat plate shape but may have a shape whose surface has a recess and a projection.

Second Embodiment

Figure 10A:
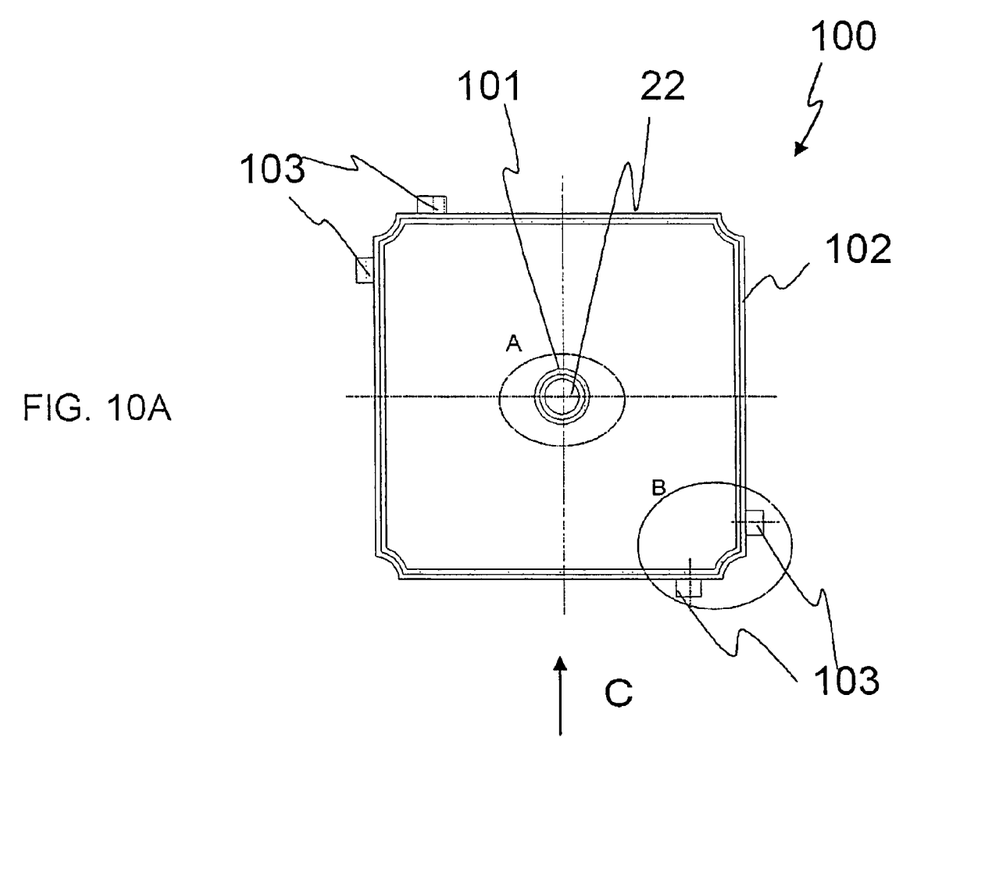
FIGS. 10A and 10B are structure diagrams of a heat spreader for explaining a second embodiment of the invention.
Figure 10B:
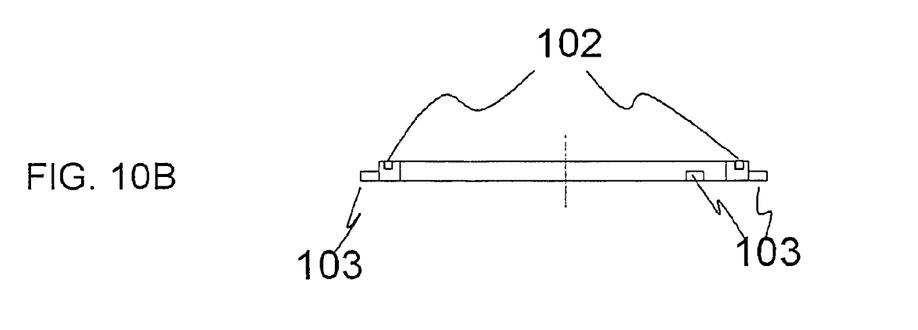

In the semiconductor device of the present embodiment, a heat spreader 100 shown in FIGS. 10A and 10B can be used.

FIG. 10A is a plan view, and FIG. 10B is a side view from the direction C. In the side view, an opening 22 and a groove 101 on the outside of the opening are not shown.

Figure 11A:
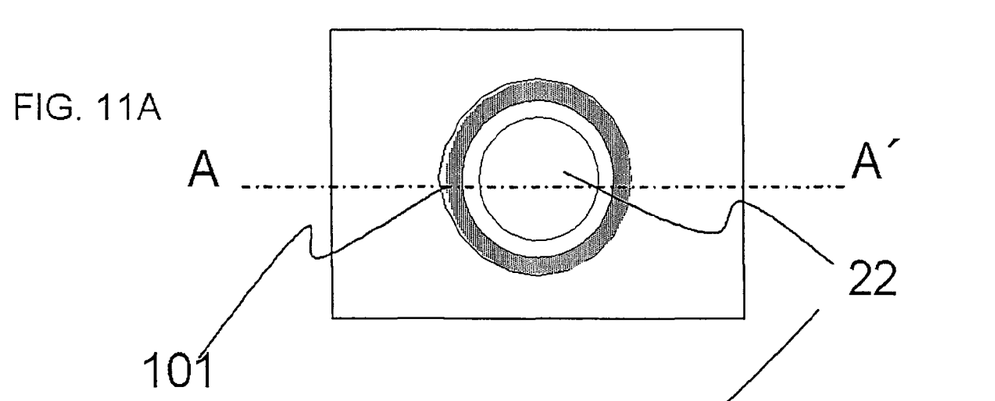
FIGS. 11A and 11B are structure diagrams of the heat spreader for explaining the second embodiment of the invention.
Figure 11B:
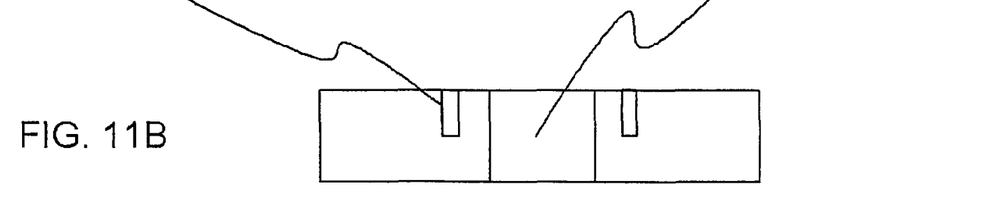
Figure 12:
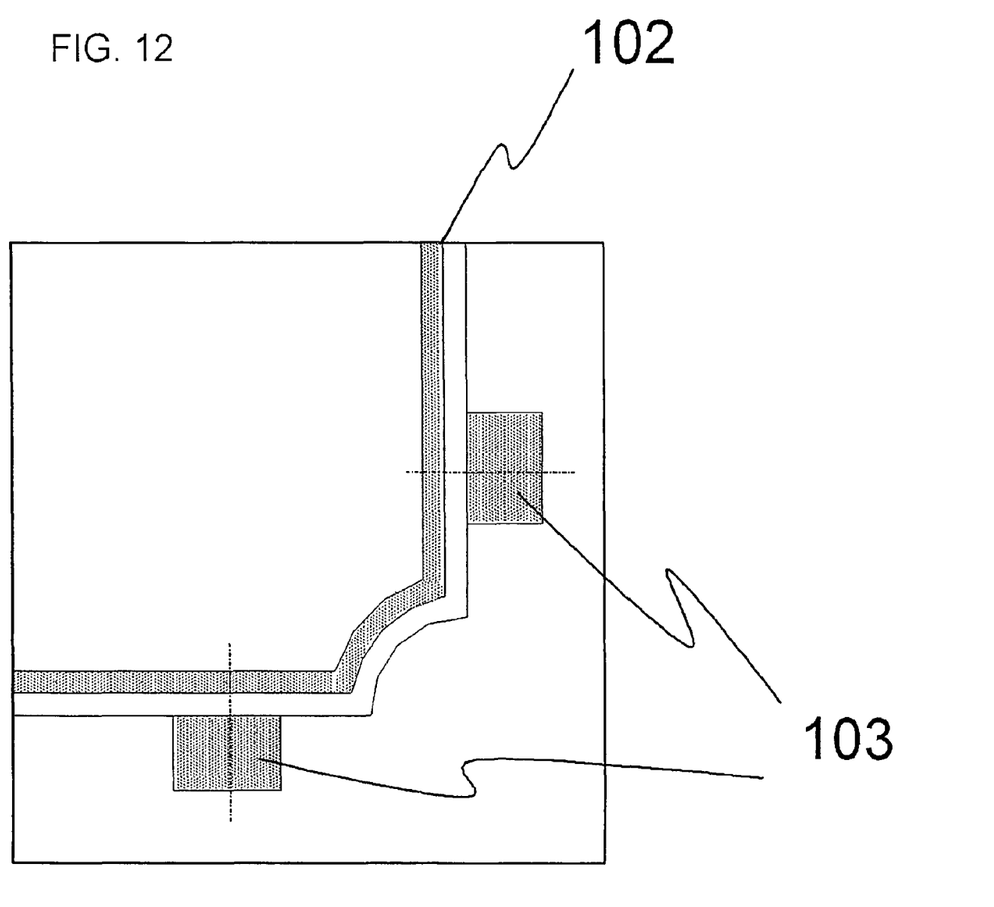
FIG. 12 is a structure diagram of the heat spreader for explaining the second embodiment of the invention.

In the heat spreader 100, the groove 101 is provided on the outside of the opening 22 in the center. Also, a groove 102 is provided on the inside of the periphery. The grooves are formed in the surface on the side opposite to a semiconductor chip at the time of mounting, that is, a surface on the side from which a resin is injected. FIGS. 11A and 11B are enlarged diagrams of a portion A in FIG. 10A, that is, a portion around the opening in the heat spreader 100. FIG. 11A is a plan view, and FIG. 11B is a cross sectional view of A-A'. FIG. 12 is an enlarged plan view of a portion B in FIG. 10A.

Figure 13:
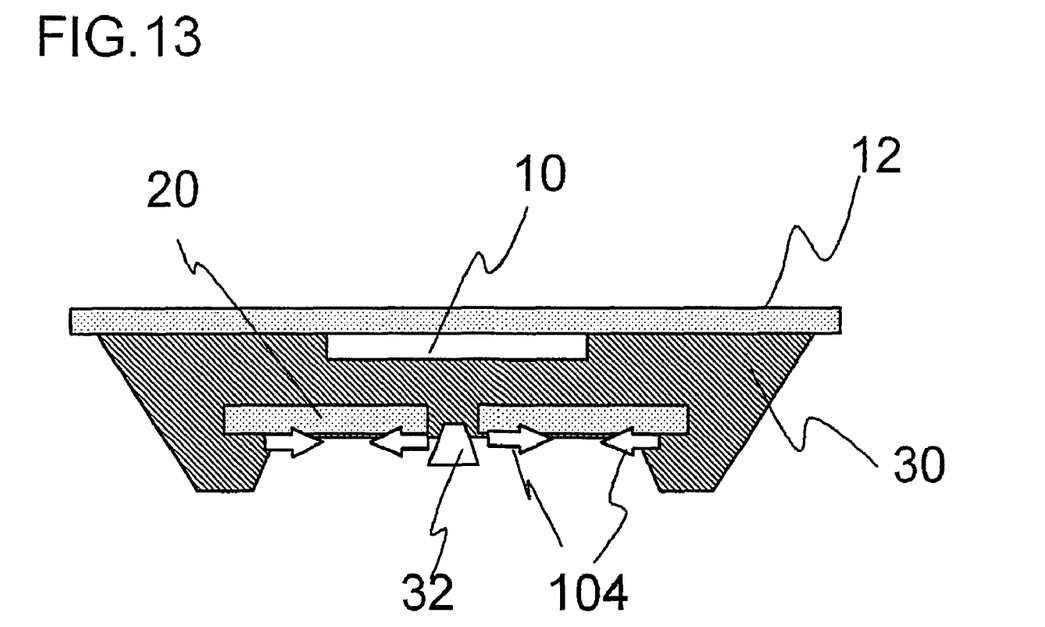
FIG. 13 is a cross sectional view of a semiconductor device for explaining the second embodiment of the invention.

As described with reference to FIGS. 5A to 5C, resin sealing is performed with a mold at the time of manufacturing a semiconductor device having the heat spreader. In FIGS. 5A to 5C, however, there is the case that the resin 30a enters the interface between the heat spreader 20 and the mounting part 744 of the lower mold 74. When the resin enters the area, the resin may remain as "resin burr" on the heat spreader 100. It deteriorates heat dissipation performance due to drop in the heat conductivity of the heat spreader, and it disturbs stamping of the serial number or the like of the semiconductor device in the area. FIG. 13 is a cross sectional view showing a state where a resin burr occurs. The arrows in the diagram show occurrence directions 104 of the resin burrs.

Figure 14:
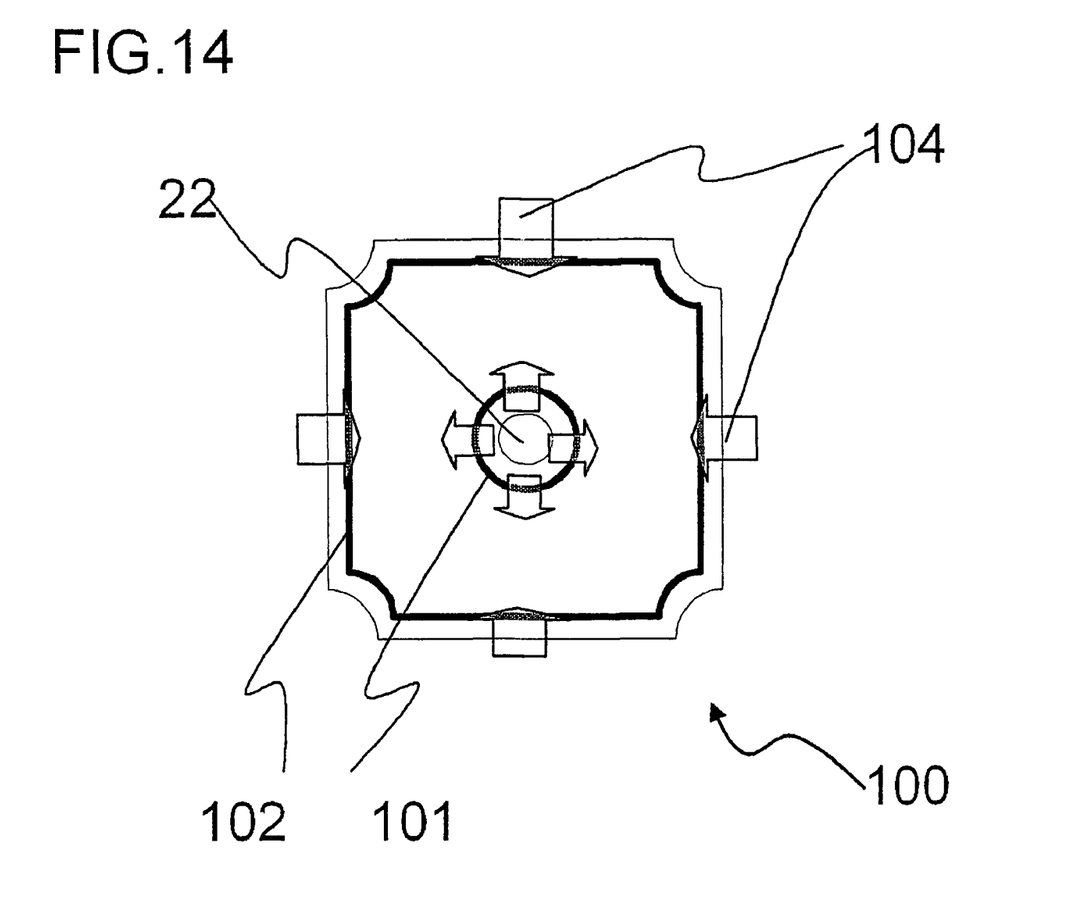
FIG. 14 is a structure diagram of the heat spreader for explaining the second embodiment of the invention.

FIG. 14 shows the heat spreader 100 of the present embodiment. The arrows 104 represent the occurrence directions of the resin burrs. The grooves 101 and 102 are provided on the outside of the opening 22 and on the inside of the periphery, respectively. Thus, even if the sealing resin spreads onto the surface of the heat spreader 100 at the time of resin injection, the resin flows in the grooves 101 and 102. Consequently, the resin can be prevented from being spread, and occurrence of a resin burr can be prevented.

It is not always necessary to provide both of the groove 101 on the outside of the opening in the heat spreader 100 and the groove 102 on the inside of the periphery of the heat spreader 100. One of the grooves 101 and 102 may be provided. Each of the grooves 101 and 102 may be formed as double or more grooves. The width, depth, distance from the opening or the periphery, and the like of each of the grooves can be properly changed according to the size and thickness of the heat spreader and the characteristics of the resin used.

The cross-sectional shape of the groove may be, but not limited to, rectangular as shown in FIGS. 10B and 11B, circular, or a part of a circle.

Next, projections 103 (FIGS. 10A and 10B and FIG. 12) provided at the periphery of the heat spreader 100 will be described.

At the time of injection of the sealing resin shown in FIGS. 5A to 5C, there may be a case that rotation (positional deviation) occurs between the heat spreader 20 and the lower mold due to the flow of the resin. By providing the both ends of the heat spreader 20 with the projections 103 projecting to an extent that they do not come into contact with the lower mold, the projections play the role of stoppers. Therefore, rotation (positional deviation) of the heat spreader can be prevented. For Example, the projections 103 are thinner than the heat spreader 20.

Figure 15:
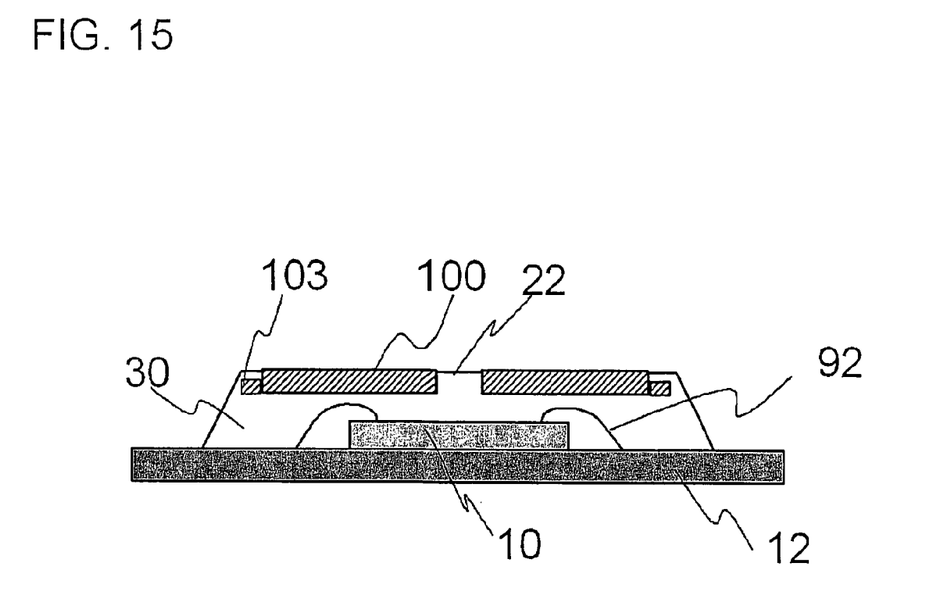
FIG. 15 is a cross sectional view of the semiconductor device for explaining the second embodiment of the invention.

The projections 103 also produce an effect of suppressing peeling between the resin 30 and the heat spreader 100 particularly in a flat-type semiconductor device (in which no resin is formed on the heat spreader) shown in FIG. 15.

Preferably, at least one projection 103 is formed around each of the opposite corners. However, the heat spreader of the present embodiment is not limited to the configuration. For example, the projections 103 may be formed in the sides of the heat spreader 100 or in the entire periphery of the heat spreader 100.

It is apparent that the present invention is not limited to the above embodiment, that may be modified and changed without departing from the scope and spirit of the invention.

What is claimed is:

1. A semiconductor device, comprising:
   a semiconductor chip mounted on a substrate;
   a heat spreader provided above said semiconductor chip, said heat spreader being spaced apart from said semiconductor chip by a uniform distance; and
   a sealing resin interposed between said semiconductor chip and said heat spreader, the sealing resin covering said semiconductor chip and less than an entirety of an upper surface of the heat spreader at a side opposite to said semiconductor chip,
   wherein said heat spreader excludes contact with any of said substrate and said semiconductor chip, and said heat spreader has an opening provided in approximately the center of said heat spreader extending through a thickness of said heat spreader.

2. The semiconductor device according to claim 1, wherein said heat spreader has a flat plate shape.

3. The semiconductor device according to claim 2, wherein said heat spreader includes one of a square plate and a circular plate.

4. The semiconductor device according to claim 1, wherein only a partial region including the periphery of the surface on the side opposite to said semiconductor chip of said heat spreader is covered with said sealing resin.

5. The semiconductor device according to claim 4, wherein said opening in said heat spreader is not covered with said sealing resin.

6. The semiconductor device according to claim 5, wherein the sealing resin includes a recess formed within said opening of said heat spreader.

7. The semiconductor device according to claim 1, wherein said semiconductor chip is mounted on said substrate by wire bonding.

8. The semiconductor device according to claim 7, wherein said heat spreader overlaps with said wire bonding.

9. The semiconductor device according to claim 1, wherein at least one groove is provided on the outside of said opening in a surface of said heat spreader on the side opposite to said semiconductor chip.

10. The semiconductor device according to claim 1, wherein at least one groove is provided on the inside of the periphery in a surface of said heat spreader on the side opposite to said semiconductor chip.

11. The semiconductor device according to claim 1, wherein a projection having a thickness less than the thickness of said heat spreader is provided at the periphery of the heat spreader.

12. The semiconductor device according to claim 11, wherein at least one projection is provided around each of opposite corners of said heat spreader.

13. The semiconductor device according to claim 11, wherein the projection is spaced apart from an upper surface of said sealing resin.

14. The semiconductor device according to claim 1, wherein end portions of said heat spreader are disposed above said semiconductor chip.

15. The semiconductor device according to claim 1, wherein the upper surface of said heat spreader is exposed through said sealing resin.

16. The semiconductor device according to claim 1, wherein a surface of said heat spreader on a side facing said semiconductor chip is spaced apart from said semiconductor chip by the uniform distance.

17. The semiconductor device according to claim 1, wherein the sealing resin covers only a peripheral portion of the upper surface of the heat spreader at the side facing opposite to said semiconductor chip.

18. A semiconductor device, comprising:
a semiconductor chip mounted on a substrate;
a heat spreader provided above said semiconductor chip, said heat spreader being spaced apart from said semiconductor chip; and
a sealing resin interposed between said semiconductor chip and said heat spreader, the sealing resin covering said semiconductor chip and only a peripheral portion of a top surface of the heat spreader,
wherein said heat spreader excludes contact with any of said substrate and said semiconductor chip, and said heat spreader has an opening provided in approximately the center of said heat spreader extending through a thickness of said heat spreader,
wherein an entire surface of said heat spreader on a side facing said semiconductor chip is in contact with said sealing resin and less than an entirety of another surface of said heat spreader on a side facing opposite to said semiconductor chip being exposed through the sealing resin, and
wherein the space between said semiconductor chip and said heat spreader is filled with said sealing resin.

19. The semiconductor device according to claim 18, wherein the space between said semiconductor chip and said heat spreader is filled with only the sealing resin.

* * * * *